| (12) | United States Patent | (10) Patent No.: US 10,790,395 B2 |
|---|---|---|
| | Ok et al. | (45) Date of Patent: Sep. 29, 2020 |

(54) FINFET WITH IMPROVED NITRIDE TO FIN SPACING

(71) Applicant: International Business Machines Corporation, Armonk, NY (US)

(72) Inventors: Injo Ok, Loudonville, NY (US); Ruilong Xie, Schenectady, NY (US); Chanro Park, Saratoga, NY (US); Min Gyu Sung, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/006,377

(22) Filed: Jun. 12, 2018

(65) Prior Publication Data

US 2020/0135927 A1    Apr. 30, 2020

(51) Int. Cl.
*H01L 29/76* (2006.01)
*H01L 29/94* (2006.01)
(Continued)

(52) U.S. Cl.
CPC ...... *H01L 29/7851* (2013.01); *H01L 21/3065* (2013.01); *H01L 21/30604* (2013.01); *H01L 21/31144* (2013.01); *H01L 21/32134* (2013.01); *H01L 21/32136* (2013.01); *H01L 21/32139* (2013.01); *H01L 29/66795* (2013.01)

(58) Field of Classification Search
CPC ............. H01L 29/785; H01L 29/66795; H01L 21/823431; H01L 27/1211;
(Continued)

(56) References Cited

U.S. PATENT DOCUMENTS 9,318,564 B2  4/2016  Mojumder et al.
9,559,014 B1  1/2017  Basker et al.
(Continued)

OTHER PUBLICATIONS

Clark et al.; "ASAP7: A 7-nm finFET predictive process design kit", Microelectronics Journal 53(2016)105-115.
(Continued)

*Primary Examiner* — Theresa T Doan
(74) *Attorney, Agent, or Firm* — Garg Law Firm, PLLC; Rakesh Garg; Joseph Petrokaitis

(57) ABSTRACT

A semiconductor device is described. The semiconductor device includes a dielectric layer oriented substantially parallelly to a substrate. The semiconductor device includes a metal layer formed on top of the dielectric layer. The semiconductor device includes a fin extending substantially orthogonally from the substrate through the dielectric layer into the metal layer. The semiconductor device includes a gate insulator deposited on top of the fins and the dielectric layer. The semiconductor device includes an optical projection lithography (OPL) material deposited on a portion of a surface area of the device to form a first covered surface area and a first exposed surface area. The semiconductor device includes a first exposed gate insulator area formed by removing the metal layer under the first exposed surface area. The semiconductor device includes a first exposed fin area formed by removing the gate insulator from the first exposed gate insulator area. The semiconductor device includes a substantially planar self-aligning gate cap filling a recess in the first exposed fin area and an adjacent area of the metal layer.

9 Claims, 12 Drawing Sheets

(51) Int. Cl.
  *H01L 29/78*    (2006.01)
  *H01L 21/3213*  (2006.01)
  *H01L 21/311*   (2006.01)
  *H01L 29/66*    (2006.01)
  *H01L 21/306*   (2006.01)
  *H01L 21/3065*  (2006.01)

(58) Field of Classification Search
  CPC ........... H01L 21/823821; H01L 21/845; H01L 27/0924; H01L 29/66477
  USPC ........................................................ 257/401
  See application file for complete search history.

(56) References Cited

U.S. PATENT DOCUMENTS

| | | |
|---|---|---|
| 9,741,823 B1 | 8/2017 | Greene et al. |
| 9,892,781 B2 | 2/2018 | Liaw |
| 2013/0313647 A1 | 11/2013 | Aquilino et al. |
| 2015/0255457 A1* | 9/2015 | Loubet ............ H01L 21/823418 257/77 |
| 2015/0270263 A1* | 9/2015 | Zhu .................... H01L 21/76224 257/386 |
| 2017/0018543 A1 | 1/2017 | Elsayed et al. |
| 2017/0054024 A1 | 2/2017 | Doris et al. |
| 2017/0154774 A1 | 6/2017 | Ok et al. |
| 2018/0040631 A1 | 2/2018 | Kim et al. |

OTHER PUBLICATIONS

Anonymous, "SRAM Bitcell Design Using Wavy Fin", Aug. 21, 2017.

Anonymous, "Method and Structure for High Strained SiGe FinFET Device beyond 7nm Node", , Sep. 28, 2016.

Anonymous, "A Method to Protect the Channel during FIN Processing while Minimizing the BOX Gouging", Jun. 2, 2016.

* cited by examiner

FINFET WITH IMPROVED NITRIDE TO FIN SPACING

TECHNICAL FIELD

The present invention relates generally to a method, system, and computer program product for fabricating gate-controlled semiconductor devices. More particularly, the present invention relates to a semiconductor device, method, and semiconductor fabrication system for a finFET with improved nitride to fin spacing.

BACKGROUND

Within the scope of the illustrative embodiments a gate-controlled semiconductor device is a device in which a gate structure controls a flow of electrons through a channel between a source structure and a drain structure. A transistor is a non-limiting example of a gate-controlled semiconductor device, where applying a potential to the gate causes electrical current to flow from a source end of the transistor to a drain end of the transistor.

A Field Effect Transistor (FET) is a specific type of transistor. A Metal Oxide Field Effect Transistor (MOSFET) is a FET fabricated using specific materials, techniques, and is suitable as a transistor for certain uses. A FET controls the electrical conductivity between a source of electric current (source) and a destination of the electrical current (drain). The FET uses a gate structure to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication.

A finFET is a non-planar device in which a source and a drain are connected using a fin-shaped conducting channel (fin) above the insulator layer. In an FET, a gate has a source-side and a drain-side. Generally, a finFET is fabricated as a multi-gate device in which two or more gates are coupled using one or more fin structures by connecting a drain of one gate to the source of another gate using a fin. For example, a fin of a finFET is usually fabricated between two gates such that the source of one gate is on one side of the fin and the drain of the other gate is on an opposite side of the fin.

A "contact" is an electrically conductive structure formed on an externally accessible surface of a semiconductor device. The semiconductor device, such as an FET, can be electrically connected into a circuit via the contacts. A contact of a semiconductor device electrically couples to one or more structures, generally a single structure, within the semiconductor device. Regardless of the planar or non-planar nature of a semiconductor device, such as the FET, various electrical contacts are generally formed or positioned on a single externally accessible surface of the device for the ease of connecting the device in a circuit.

For example, in a transistor device, one contact connects to the gate structure in the device, one contact connects to the source structure in the device, and one contact connects to the drain structure in the device. Depending on the type of the transistor, additional contacts may be available, e.g., a contact connecting to the fin in a finFET.

A CA contact is an electrical connection that connects to a source/drain (S/D) structure in a finFET. A circuit external to the finFET uses the CA contact to electrically connect a part of the circuit to a source or a drain in the finFET. A CB contact is an electrical connection that connects to a gate. A circuit external to the finFET uses the CB contact to electrically connect a part of the circuit to a gate in the finFET.

A TS contact is an electrical contact that provides electrical connectivity to the one or more fins that connect two or more gates to one another. Presently, the TS contact is also fabricated on the same surface as the CB contact, although electrically insulated from the CB contact. A circuit external to the finFET uses the TS contact to electrically connect a part of the circuit to a fin in the finFET.

A CA contact can be fabricated to electrically couple to the TS contact. However fabricated, the CA contact(s) should be electrically insulated from the CB contact.

Continuing trends in semiconductor device manufacturing include a reduction in electrical device feature size (scaling). With increasing scaling, new processing sequences and methods may be required to avoid shorting of adjacent electrical devices.

A substrate contemplated within the scope of the illustrative embodiments can be formed using any suitable substrate material, such as, for example, monocrystalline Silicon (Si), Silicon-Germanium (SiGe), Silicon-Carbon (SiC), compound semiconductors obtained by combining group III elements from the periodic table (e.g., Al, Ga, In) with group V elements from the periodic table (e.g., N, P, As, Sb) (III-V compound semiconductor), compounds obtained by combining a metal from either group 2 or 12 of the periodic table and a nonmetal from group 16 (the chalcogens, formerly called group VI) (II-VI compound semiconductor), or semiconductor-on-insulator (SOI). In some embodiments of the invention, the substrate includes a buried oxide layer (not depicted). Fins (not shown) are semiconductor structures that are formed using the same material or different materials from the substrate.

Fins can be formed by any suitable patterning techniques, including but not limited to, lithography followed by etching. Other suitable techniques, such as sidewall image transfer (SIT), self-aligned double patterning (SADP), self-aligned multiple patterning (SAMP), self-aligned quadruple patterning (SAQP) can be used.

Source and drain structures are formed on the opposite sides of a gate. An S/D structure is offset or separated from the gate by one or more gate spacers. In one example embodiment, source and drain structures are formed from an in-situ doped (i.e., during growth) epitaxial material such as in-situ doped epitaxial Si, carbon doped silicon (Si:C) and/or SiGe. Suitable n-type dopants include but are not limited to phosphorous (P), and suitable p-type dopants include but are not limited to Boron (B). The use of an in-situ doping process is merely an example. For instance, an ex-situ process can be used instead of the in-situ process to introduce dopants into the source and drain structures. Other doping techniques include but are not limited to, ion implantation after the bottom source/drain are formed. Doping techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Gate spacers are formed using a suitable spacer material. Some examples of the spacer material include, but are not limited to, Silicon nitride (SiN), Silicon carbide (SiC), Carbon-doped Silicon oxide (SiOC), Silicon-carbon-nitride (SiCN), Boron nitride (BN), Silicon Boron nitride (SiBN), Silicoboron carbonitride (SiBCN), Silicon oxycabonitride (SiOCN), Silicon oxynitride (SiON), and combinations thereof. The spacer material also acts as a dielectric material. The dielectric material used as spacer material can be a suitable low-k (low dielectric constant) material, such as a material having a dielectric constant less than approximately 7, or preferably less than approximately 5.

A gate can comprise a gate dielectric and a gate conductor. Generally, the gate dielectric is a high-k (high dielectric constant) dielectric material. Gate dielectric can comprise any suitable dielectric material, including but not limited to silicon oxide, silicon nitride, silicon oxynitride, other high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, aluminum, magnesium. A gate structure of the gate dielectric material can be formed by any suitable process or any suitable combination of multiple processes, including but not limited to, furnace oxidation, rapid thermal oxidation, dry oxidation, wet oxidation, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also contemplated.

The gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Contacts, such as TS contact, CA/CB contacts are metallic contact. A metal contact can be formed or filled using, but is not limited to, tungsten (W), aluminum (Al), or copper (Cu), cobalt (Co), Nickel (Ni), which can further include a barrier layer. The barrier layer can be, but is not limited to, titanium nitride (TiN), tantalum nitride (TaN), hafnium nitride (HfN), niobium nitride (NbN), tungsten nitride (WN), or combinations thereof, where the barrier layer can prevent diffusion and/or alloying of the metal contact fill material with the top source drain material, and/or anode/cathode material. In various embodiments, the barrier layer can be conformally deposited in the trench(es) by ALD, CVD, MOCVD, PECVD, or combinations thereof. In various embodiments, the metal fill can be formed by ALD, CVD, and/or PVD to form the electrical contacts.

A mask can be used for patterning, etching, recessing, and many other purposes. A mask contemplated herein can be a photoresist mask or a sacrificial hard mask.

For the purposes of the illustrative embodiments, the orientation of the device is described in a three-dimensional space using X, Y, and Z coordinate system. The plane of fabrication is assumed to be the X-Z plane, with vertical structures above the fabrication plane extending in +Y direction and the vertical structures below the fabrication plane extending in −Y direction. This example orientation is not intended to be limiting. From this disclosure, those of ordinary skill in the art will be able to conceive other orientations of semiconductor devices in which an embodiment described herein can be adapted, and such alternate orientations and adaptations are contemplated within the scope of the illustrative embodiments.

SUMMARY

The illustrative embodiments provide a semiconductor device, method, and semiconductor fabrication system. An embodiment includes a semiconductor device that includes a dielectric layer oriented substantially parallelly to a substrate. The embodiment includes a metal layer formed on top of the dielectric layer. The embodiment includes a fin extending substantially orthogonally from the substrate through the dielectric layer into the metal layer. The embodiment includes a gate insulator deposited on top of the fins and the dielectric layer. The embodiment includes an optical projection lithography (OPL) material deposited on a portion of a surface area of the device to form a first covered surface area and a first exposed surface area. The embodiment includes a first exposed gate insulator area formed by removing the metal layer under the first exposed surface area. The embodiment includes a first exposed fin area formed by removing the gate insulator from the first exposed gate insulator area. The embodiment includes a substantially planar self-aligning gate cap filling a recess in the first exposed fin area and an adjacent area of the metal layer.

An embodiment includes a method to fabricate a semiconductor device. The method enables a fabrication system to fabricate a finFET with improved nitride to fin spacing.

An embodiment includes a semiconductor fabrication system. The semiconductor fabrication system includes a processor, a computer-readable memory, a computer-readable storage device, and program instructions stored on the storage device for execution by the processor via the memory, the stored program instructions causing the fabrication system to perform operations to fabricate a finFET with improved nitride to fin spacing.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments are described using a transistor, particularly a finFET type MOSFET as a specific example which can be improved in a manner described herein. Any reference to a transistor, finFET, or MOSFET is not intended to be limiting on the illustrative embodiments. An embodiment described herein can be adapted to address similar problems in other devices where nitride to fin spacing requires improvement.

Figure 1:
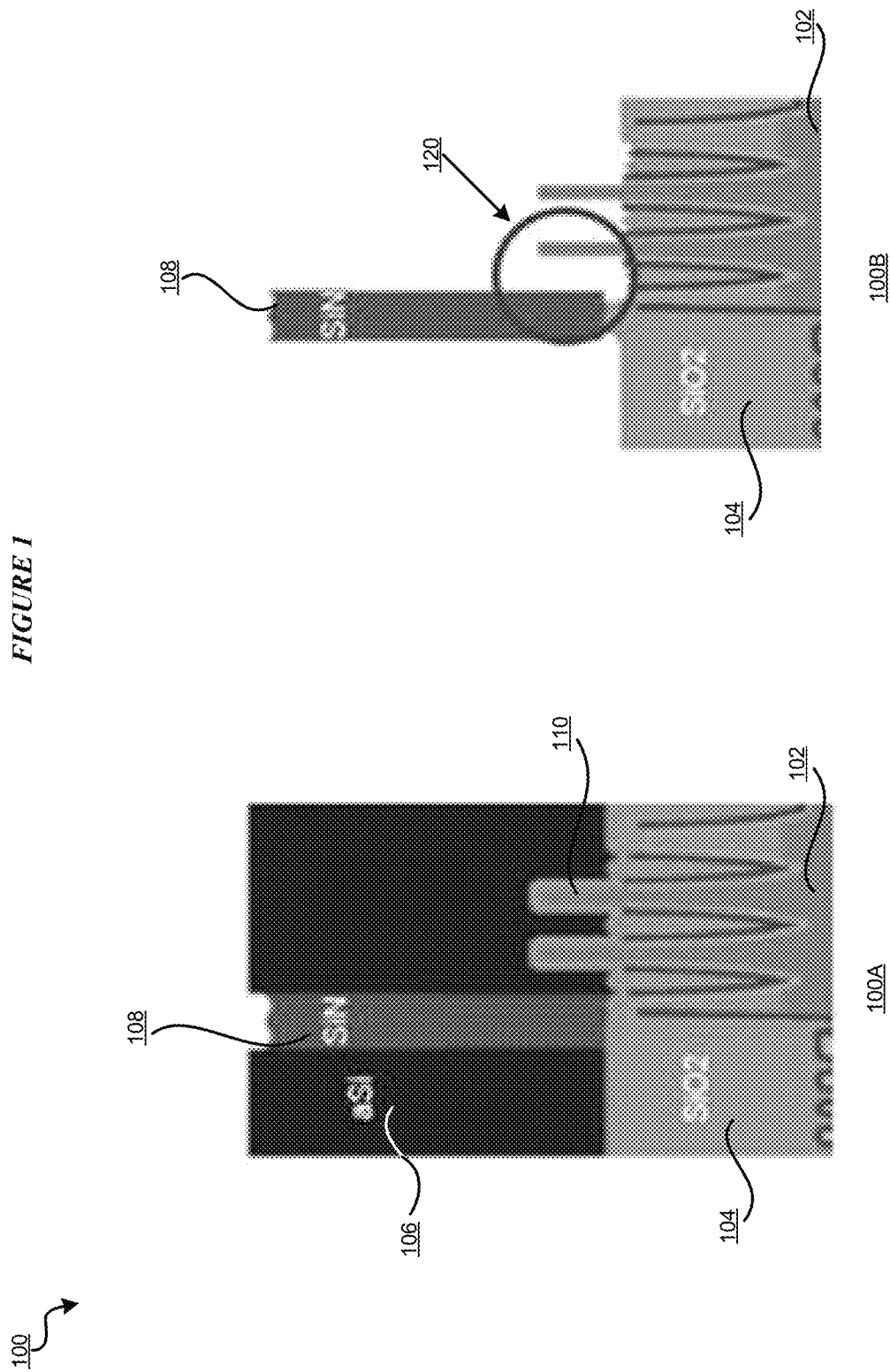
FIG. 1 illustrates, in a cross-sectional view, several steps in the formation of an example finFET, formed according to a presently available process.

FIG. 1 illustrates, in a cross-sectional view, several steps in the formation of an example finFET 100, formed according to a presently available process. Cross-sections 100A and 100B are cross sectional views of finFET 100 along the amorphous polysilicon (PC) cut that will be filled with insulator material to separate PC areas, showing a gate structure.

A fabrication process for semiconductor device fabrication uses a wafer of a suitable substrate, such as silicon, and fabricates finFET 100. FinFET 100 is a semiconductor device and comprises a set of transistors. FinFET 100 includes substrate 102, shallow trench insulator (STI) 104, and PC dummy fill 106. Insulator 108 separates two dummy fills 106. Fin channels 110 extend from substrate 102 through STI 104 into PC dummy fill 106. Cross-section 100A shows finFET 100 after filling insulator 108. Cross-section 100B shows finFET 100 after removal of PC dummy fill 106 and the extended gate oxide layer over fin channels 110.

Substrate 102 and fin channels 110 can be formed using any suitable substrate material, such as, for example, monocrystalline silicon (Si), silicon-germanium (SiGe), SiC, III-V compound semiconductor, II-VI compound semiconductor, or semiconductor-on-insulator (SOI). STI 104 may be a semiconductor material, for example silicon dioxide. Insulator 108 may be an insulator material, for example silicon nitride.

Figure 2:
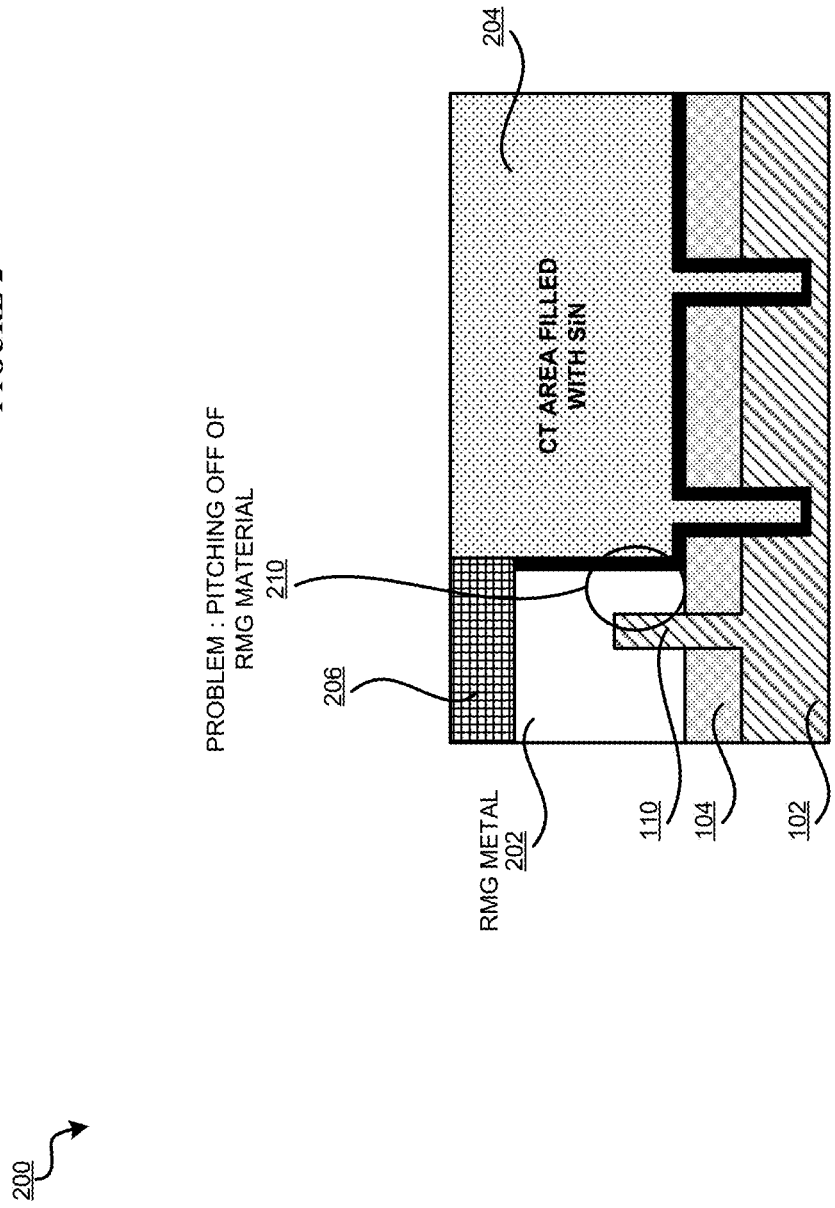
FIG. 2 depicts, in a cross-sectional view, an example finFET, formed according to a presently available process.

The illustrative embodiments recognize that as fabrication processes and device structure sizes become ever smaller, not enough space is available to fabricate the necessary elements to produce a reliable device. FIG. 2 illustrates this phenomenon. FIG. 2 depicts, in a cross-sectional view parallel to the PC dummy fill and passing through fin channels 110, an example finFET 200, formed according to a presently available process. FinFET 200 includes substrate 102, STI 104, and fin channels 110, which are the same as substrate 102, STI 104, and fin channels 110 in FIG. 1.

FinFET 200 also includes replaced metal gate (RMG) 202, insulator area 204, and silicon nitride area 206. RMG 202 is used to tune the gate work function to control transistor gate and threshold voltage, and may be any suitable gate material, for example TiN, TiC, AlTaN, TaN, and TaAlN. Insulator area 204 is a PC cut area, where PC has been replaced by an insulator, for example SiN, to disconnect the PC of one device from the PC of another device. Location 210 shows pitching off of RMG 202.

When fabricating finFETs for use in static random access memory (SRAM) using 7 nanometer (nm) processes, 16 nm is required to accommodate the necessary elements (6 nm overlay margin+1.7 nm for the RMG dielectric layer+3 nm for the RMG metal layer+4.5 nm amorphous silicon). Even using a 4 nm overlay margin only provides a 2 nm margin for amorphous silicon deposition, and the problem becomes worse with smaller geometries.

Further, the wet process used to remove amorphous silicon cannot completely remove all the amorphous silicon in the insulator-to-fin. As a result, after the amorphous silicon is cut to form the gate area, the insulator-to-fin space becomes even smaller, and could easily be pinched-off with the amorphous silicon during the high-k reliability anneal, causing leakage issues.

Additionally, static random access memory (SRAM) has areas where FC and PC overlap. Performing an FC cut during the RMG portion of the fabrication process can cut the RMG metal in the overlap area, leading to problems.

The finFETs shown in FIGS. 1 and 2 are shown during a fabrication process that fills insulator 108 before the reliability anneal, creating the problems described. The illustrative embodiments recognize a need to form insulator 108 after the RMG reliability anneal. Without having to protect insulator 108 during filling and removing the amorphous silicon layer for the anneal process, space needed for protective layers can be saved. As well, the filling and removing steps become easier, leading to a more reliable finished product. Such a process also eliminates the FC-PC overlap areas described herein, allowing a 20-80 nanometer reduction in the Y axis CD of a finished SRAM.

The illustrative embodiments used to describe the invention generally address and solve the above-described needs and other problems related to fabricating a finFET with improved nitride to fin spacing. The illustrative embodiments provide a fabrication method for a finFET that produces the insulator column later in the fabrication process, in the middle-of-line (MOL) module of the fabrication process after the reliability anneal. Performing the PC and fin cuts together, in the MOL module, resolves these issues.

An embodiment comprises a semiconductor device described herein. Another embodiment comprises a fabrication process for the contemplated semiconductor device and can be implemented as a software application. The software application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to fabricate an asymmetric air spacer gate-controlled device with reduced parasitic capacitance, as described herein.

For the clarity of the description, and without implying any limitation thereto, the illustrative embodiments are described using a specific type of gate-controlled device, to wit, generally a MOSFET and specifically a finFET. Within the scope of the illustrative embodiments, an embodiment can be implemented with a variety of other devices, where closely-spaced elements pose similar spacing problems as are recognized with a finFET.

Furthermore, simplified diagrams of the example structures, elements, and device(s) are used in the figures and the illustrative embodiments. In an actual fabrication of a proposed device, additional structures that are not shown or described herein, or structures different from those shown and described herein, may be present without departing the scope of the illustrative embodiments. Similarly, within the scope of the illustrative embodiments, a shown or described structure in the example device may be fabricated differently to yield a similar operation or result as described herein.

Differently shaded portions in the two-dimensional drawing of the example structures, layers, and formations are intended to represent different structures, layers, and formations in the example fabrication, as described herein. The different structures, layers, and formations may be fabricated using suitable materials that are known to those of ordinary skill in the art as belonging to the same class of materials described herein.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

Furthermore, the illustrative embodiments are described with respect to a specific actual or hypothetical semiconductor device only as an example. The steps described by the various illustrative embodiments can be adapted for fabricating a variety of planar and non-planar devices in a similar manner, and such adaptations are contemplated within the scope of the illustrative embodiments. The specific contact placements are also used only as non-limiting examples to describe certain options possible with the illustrative embodiments. Those of ordinary skill in the art will be able to use an embodiment to similarly provide electrical access to a layer or structure in a similar manner, and such usage is also contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A device of an embodiment described herein, comprises substantial advancement of the semiconductor device fabrication technologies. A manner of forming a finFET with improved nitride to fin spacing as described herein is unavailable in the presently available methods. Presently available methods produce undesirable margins for amorphous silicon deposition and can cause leakage issues. Thus, a substantial advancement of such devices or data processing systems by executing a method of an embodiment is in an improved fabrication process where competing objectives are achieved from improved nitride to fin spacing in the fabricated device.

The illustrative embodiments are described with respect to certain types of devices, electrical properties, structures, formations, layers, orientations, directions, steps, operations, planes, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures.

The examples in this disclosure are used only for the clarity of the description and are not limiting to the illustrative embodiments. Additional structures, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 3:
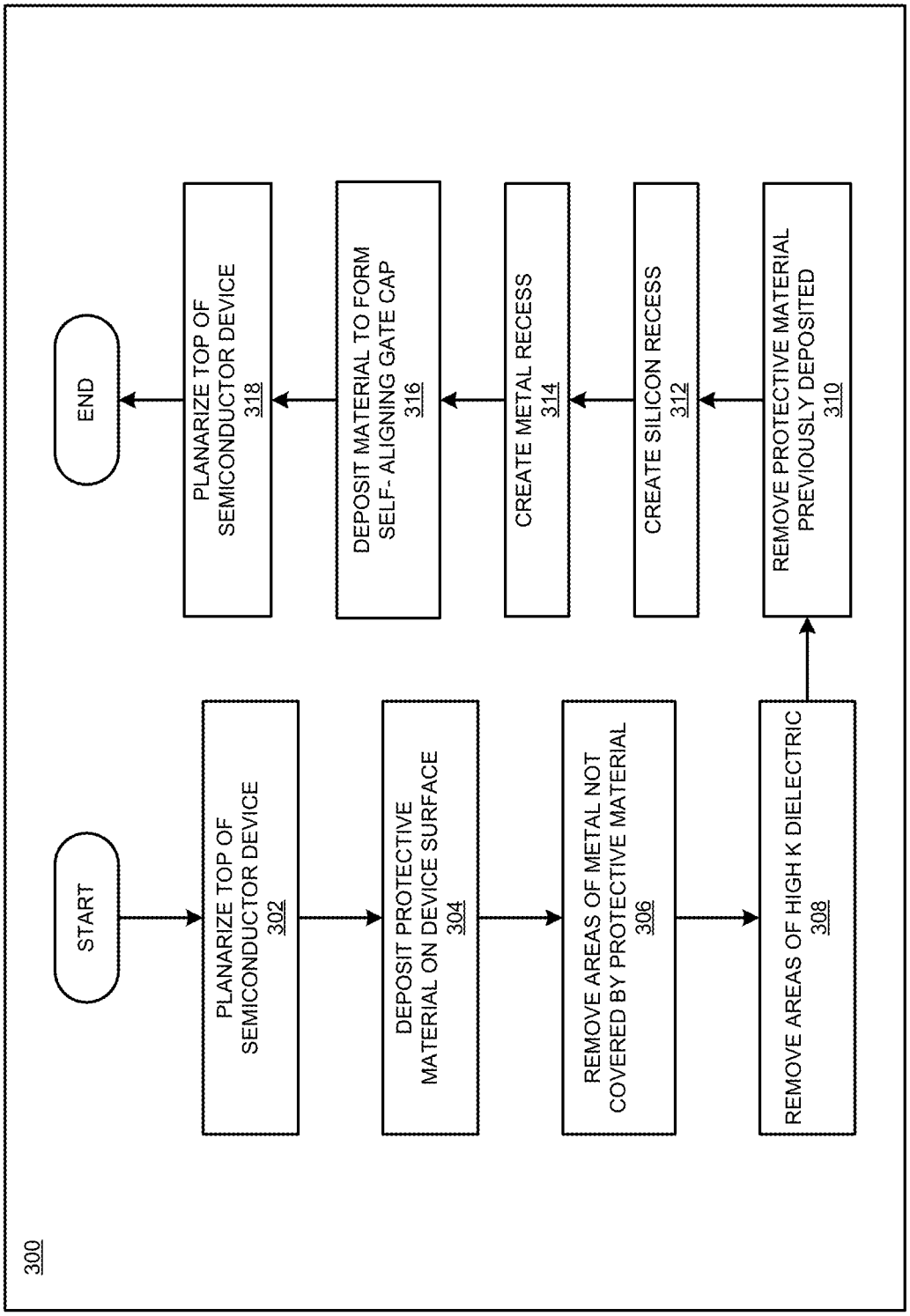
FIG. 3 depicts a flowchart showing several example steps in fabricating a finFET with improved nitride to fin spacing according to an illustrative embodiment.

FIG. 3 depicts a flowchart 300 showing several example steps in fabricating a finFET with improved nitride to fin spacing according to an illustrative embodiment. First, in step 302, the embodiment causes the fabrication process to planarize the top of a semiconductor device, using for example a chemical mechanical polishing (CMP) process. Next, in step 304, the embodiment causes the fabrication process to deposit a protective material, for example optical projection lithography (OPL) material, on the surface of the device to protect the covered area from subsequent etching steps. The fabrication process can use for example, a lithographic process also used to define areas for fin, or FC, cuts used to cut fins to a specific length and CT cuts used cut process gate ends. Next, in step 306, the embodiment causes the fabrication process to etch or remove areas of metal not covered by OPL material, exposing areas of gate insulator. The gate insulator, made of high K dielectric material, lies between silicon fins and metal gates, to control voltage between gates and fins. Next, in step 308, the embodiment causes the fabrication process to etch or remove the exposed areas of gate insulator. Next, in step 310, the embodiment causes the fabrication process to etch or remove the OPL material previously deposited in step 304. Next, in step 312, the embodiment causes the fabrication process to create a silicon recess for the FC cut, using for example a RIE (reactive ion etching) process such as a $CF_4+O_2$ mixture, $SF_6$, $CF_4$, $C_4F_8$, or a KOH/EDP based wet process. Next, in step 314, the embodiment causes the fabrication process to create a metal recess for the FC cut using for example a chlorides or fluorides based plasma RIE such as $Cl_2$, $BC_{13}$, $SF_6$, $CF_4$, $CHF_3$, $O_2$, $O_3$, $CO_2$, $H_2O$ or wet process such as $SC_2$ ($HCl+H_2O_2+DIW$) or HF/HN $O_3/H_2O$ and $NH_4OH/H_2O_2$ solution that is selective to silicon dioxide and silicon nitride. Steps 312 and 314 can optionally be combined. Next, in step 316, the embodiment causes the fabrication process to deposit material to form a self-aligning gate cap (SAC). Finally, in step 318, the embodiment causes the fabrication process to re-planarize the top of the semiconductor device, using for example a CMP process.

Figure 4:
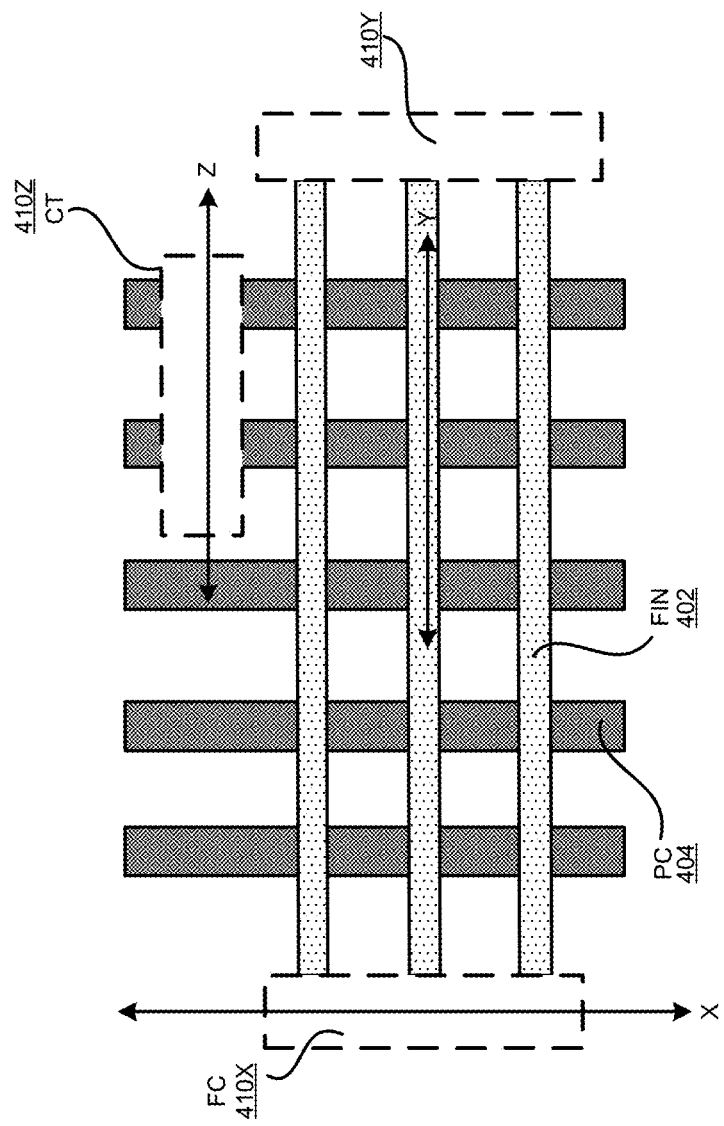
FIG. 4 depicts a portion of an exemplary semiconductor device partway through a fabrication process in accordance with an illustrative embodiment.

FIG. 4 depicts a portion of exemplary semiconductor device 400 partway through a fabrication process in accordance with an illustrative embodiment. Device 400 includes fins 402 and gate 404 formed orthogonally and on top of fins 402. The configuration shown is not intended to be limiting, and other configurations of fins 402 and gate 404 are also contemplated within the scope of the illustrative embodiments. Cross-section area 410X depicts an FC cut along section X, parallel to gate 404 and passing through fins 402. Cross-section area 410Y, parallel to cross-section area 410X, depicts a cross section of gate 404 along the top of fins 402. Cross-section area 410Z depicts an CT cut along section Z, parallel to but not on fins 402 and passing through gate 404.

FIGS. 5-11 depict results of several steps in an example process for fabricating a finFET with improved nitride to fin spacing according to an illustrative embodiment. FIGS. 5-11 each depict three cross-sections of semiconductor device 500: cross-section 500X in the place of cross-section area 410X of FIG. 4, cross-section 500Y in the place of cross-section area 410Y of FIG. 4, and cross-section 500Z in the place of cross-section area 410Z of FIG. 4. Semiconductor device 500 in each of FIGS. 5-11 is the same as semiconductor device 400 in FIG. 4, and cross-sections 500X, 500Y, and 500Z in each of FIGS. 5-11 are all the same.

Figure 5:
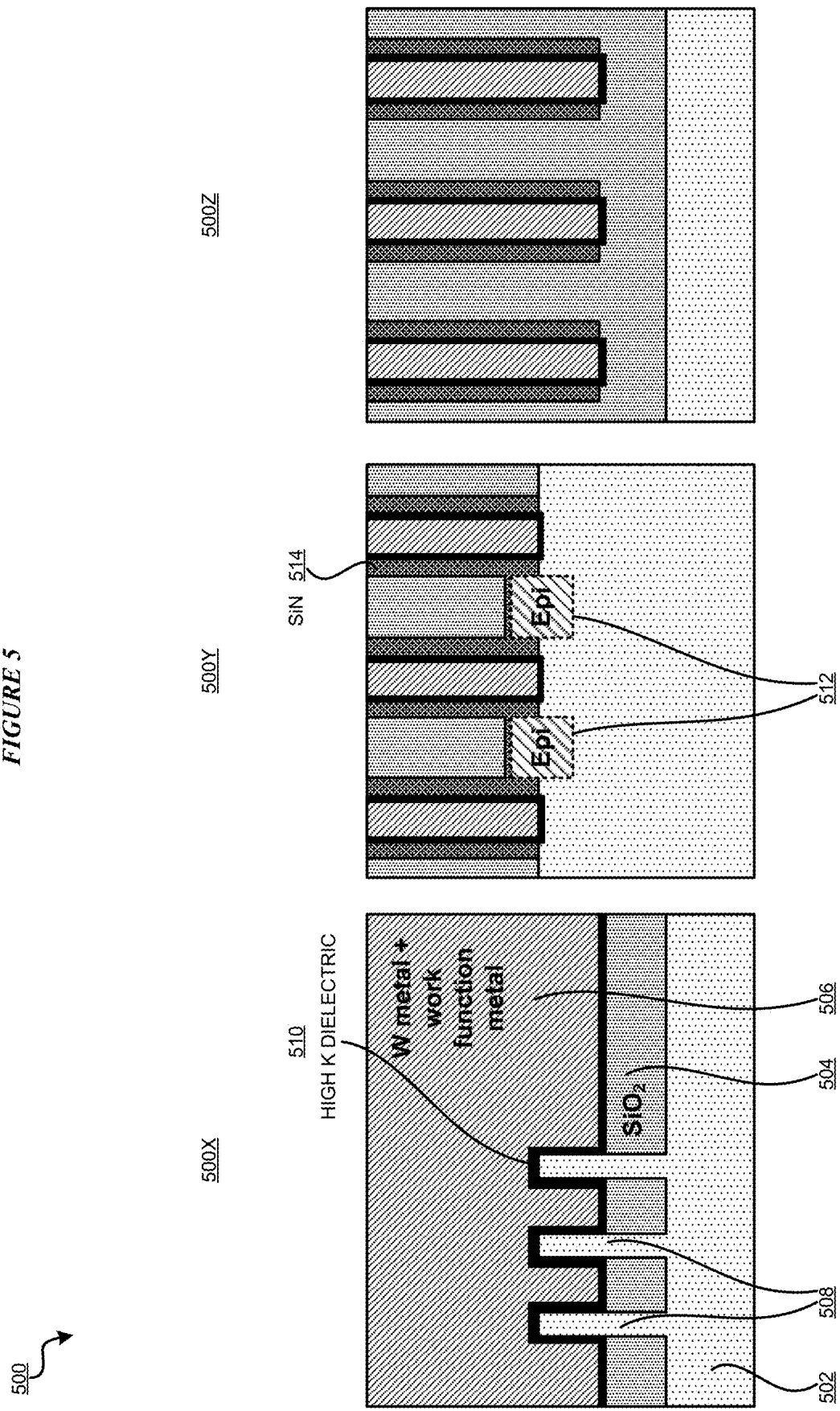
FIG. 5 depicts results of a step in an example process for fabricating a finFET with improved nitride to fin spacing according to an illustrative embodiment.

In FIG. 5, cross-sections 500X, 500Y, and 500Z depict the results of step 302. A fabrication process for semiconductor device fabrication uses a wafer of a suitable substrate, such as silicon, and fabricates device 500. Device 500 is a semiconductor device and comprises a set of transistors. Device 500 includes substrate 502, silicon dioxide ($SiO_2$) layer 504, and gate 506. Fins 508 extend from substrate 502 through $SiO_2$ layer 504 and into gate 506. High-k dielectric (insulator) material 510 forms a layer over fins 508 and $SiO_2$ layer 504. Epitaxy (singular "epi", plural "epis") 512 and insulator 514 are also shown.

A metal gate (not shown) lies between high-k dielectric material 510 and gate 506. The metal NFET or PFET gate may be a work-function metal such as TaN, TiN, TiCN, or TiAlN.

Substrate 502 is the same as substrate 102 in FIG. 1. Fins 508 may be formed from any suitable substrate material. High-k dielectric material 510 may be any suitable material, such as silicon oxide, $HfO_2$, $ZrO_2$, HFSiON, or $Al_2O_3$. Gate 506 may be any suitable metal, for example tungsten.

Figure 6:
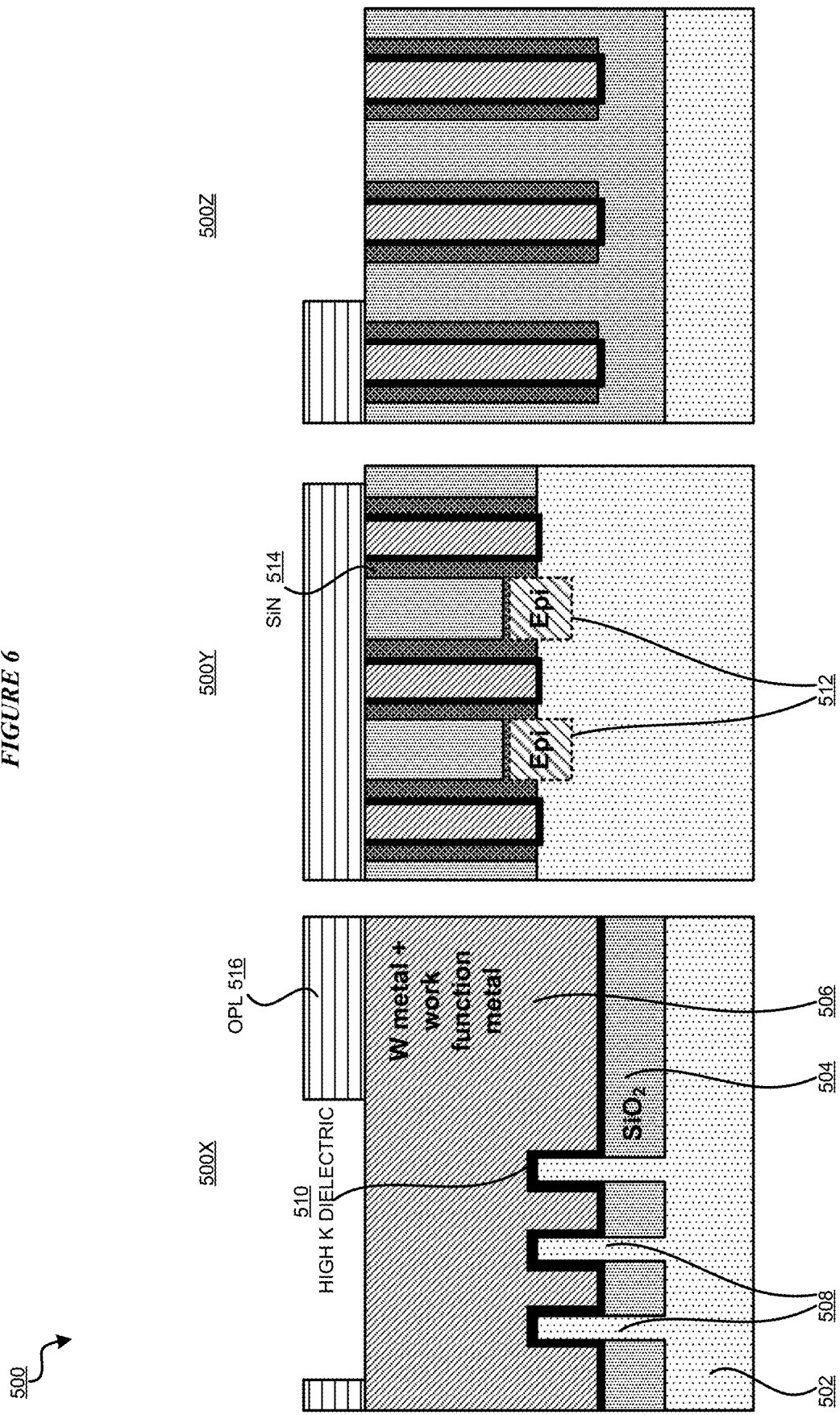
FIG. 6 depicts results of another step in an example process for fabricating a finFET with improved nitride to fin spacing according to an illustrative embodiment.

In FIG. 6, cross-sections 500X, 500Y, and 500Z depict the results of step 304. Substrate 502, $SiO_2$ layer 504, gate 506, fins 508, high-k dielectric material 510, epi 512 and insulator 514 are the same as substrate 502, $SiO_2$ layer 504, gate 506, fins 508, high-k dielectric material 510, epi 512 and insulator 514 in FIG. 5. FIG. 6 shows OPL material 516 deposited on top of device 500, as a result of a process, for example an FC and CT lithographic process as described herein.

Figure 7:
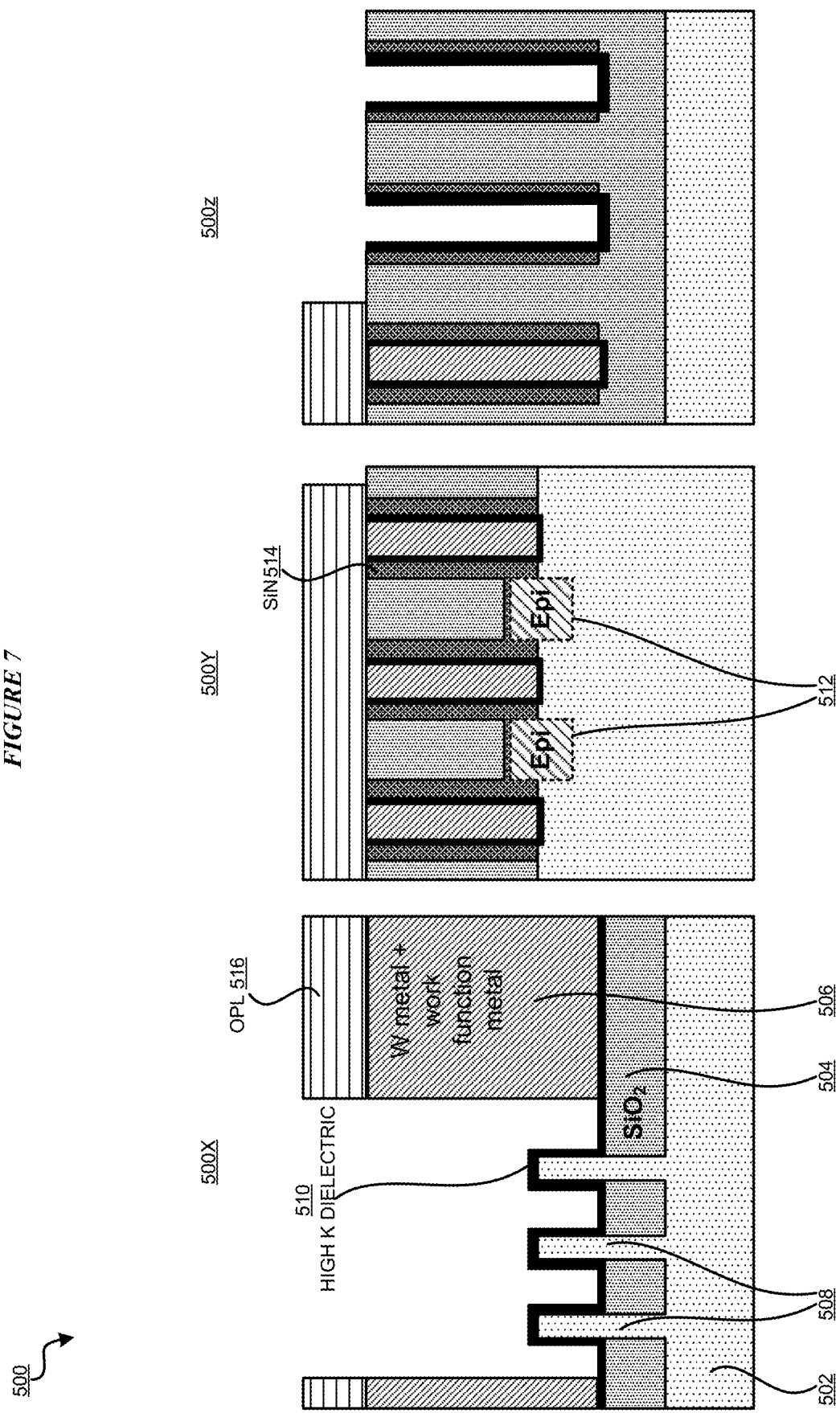
FIG. 7 depicts results of another step in an example process for fabricating a finFET with improved nitride to fin spacing according to an illustrative embodiment.

In FIG. 7, cross-sections 500X, 500Y, and 500Z depict the results of step 306. Substrate 502, $SiO_2$ layer 504, gate 506, fins 508, high-k dielectric material 510, epi 512, insulator 514, and OPL material 516 are the same as substrate 502, $SiO_2$ layer 504, gate 506, fins 508, high-k dielectric material 510, epi 512, insulator 514, and OPL material 516 in FIG. 6. FIG. 7 shows the results of an etch, which removes areas of gate 506 not covered by OPL material 516.

Figure 8:
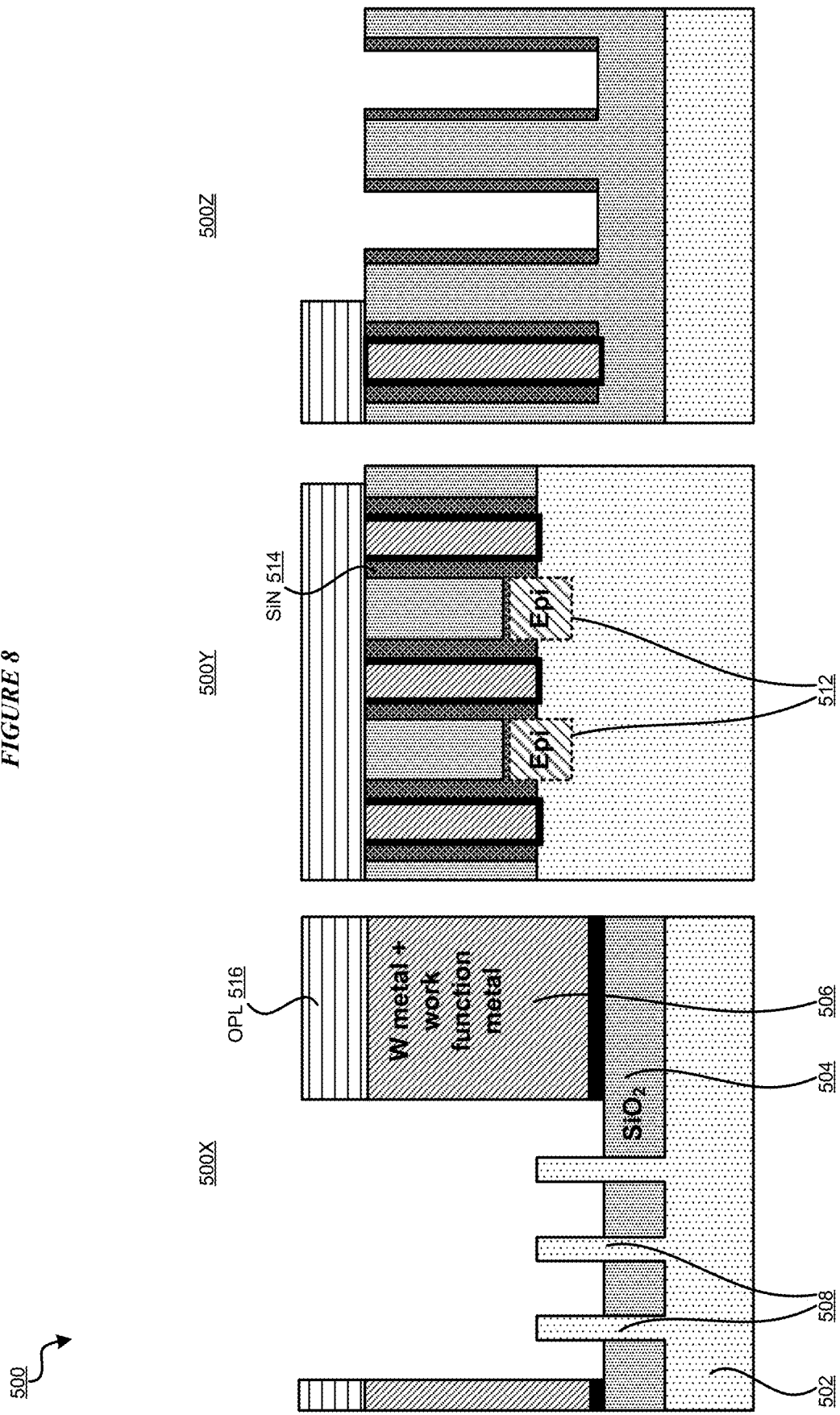
FIG. 8 depicts results of another step in an example process for fabricating a finFET with improved nitride to fin spacing according to an illustrative embodiment.

In FIG. 8, cross-sections 500X, 500Y, and 500Z depict the results of step 308. Substrate 502, $SiO_2$ layer 504, gate 506, fins 508, high-k dielectric material 510, epi 512, insulator 514, and OPL material 516 are the same as substrate 502, $SiO_2$ layer 504, gate 506, fins 508, high-k dielectric material 510, epi 512, insulator 514, and OPL material 516 in FIG. 7. FIG. 8 shows the results of a process, as described herein, which removes high-k dielectric material 510 from around fins 508.

Figure 9:
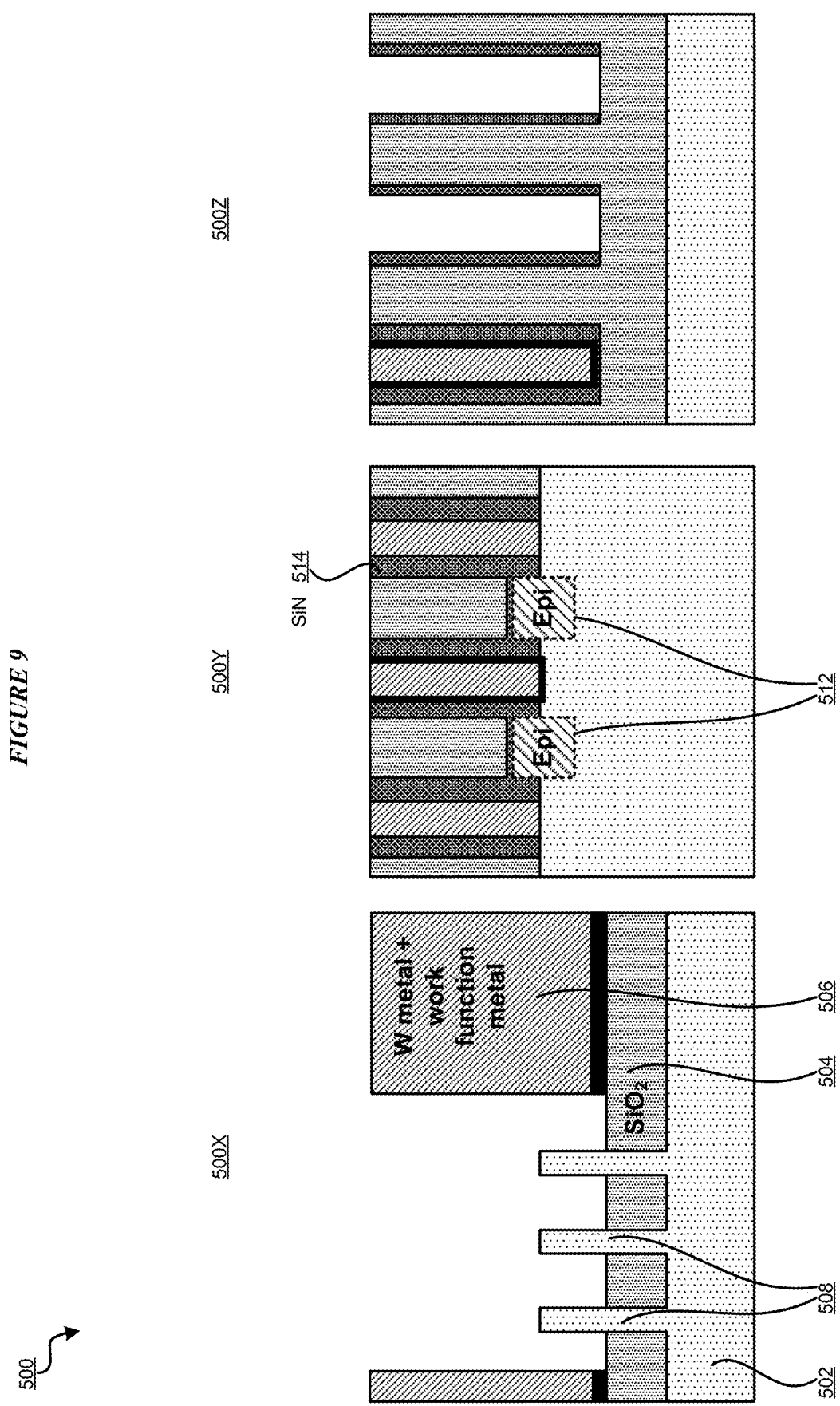
FIG. 9 depicts results of another step in an example process for fabricating a finFET with improved nitride to fin spacing according to an illustrative embodiment.

In FIG. 9, cross-sections 500X, 500Y, and 500Z depict the results of step 310. Substrate 502, $SiO_2$ layer 504, gate 506, fins 508, high-k dielectric material 510, epi 512, and insulator 514 are the same as substrate 502, $SiO_2$ layer 504, gate 506, fins 508, high-k dielectric material 510, epi 512, and insulator 514 in FIG. 8. FIG. 9 shows the results of a process, as described herein, which removes OPL material 516 previously deposited in step 304.

Figure 10:
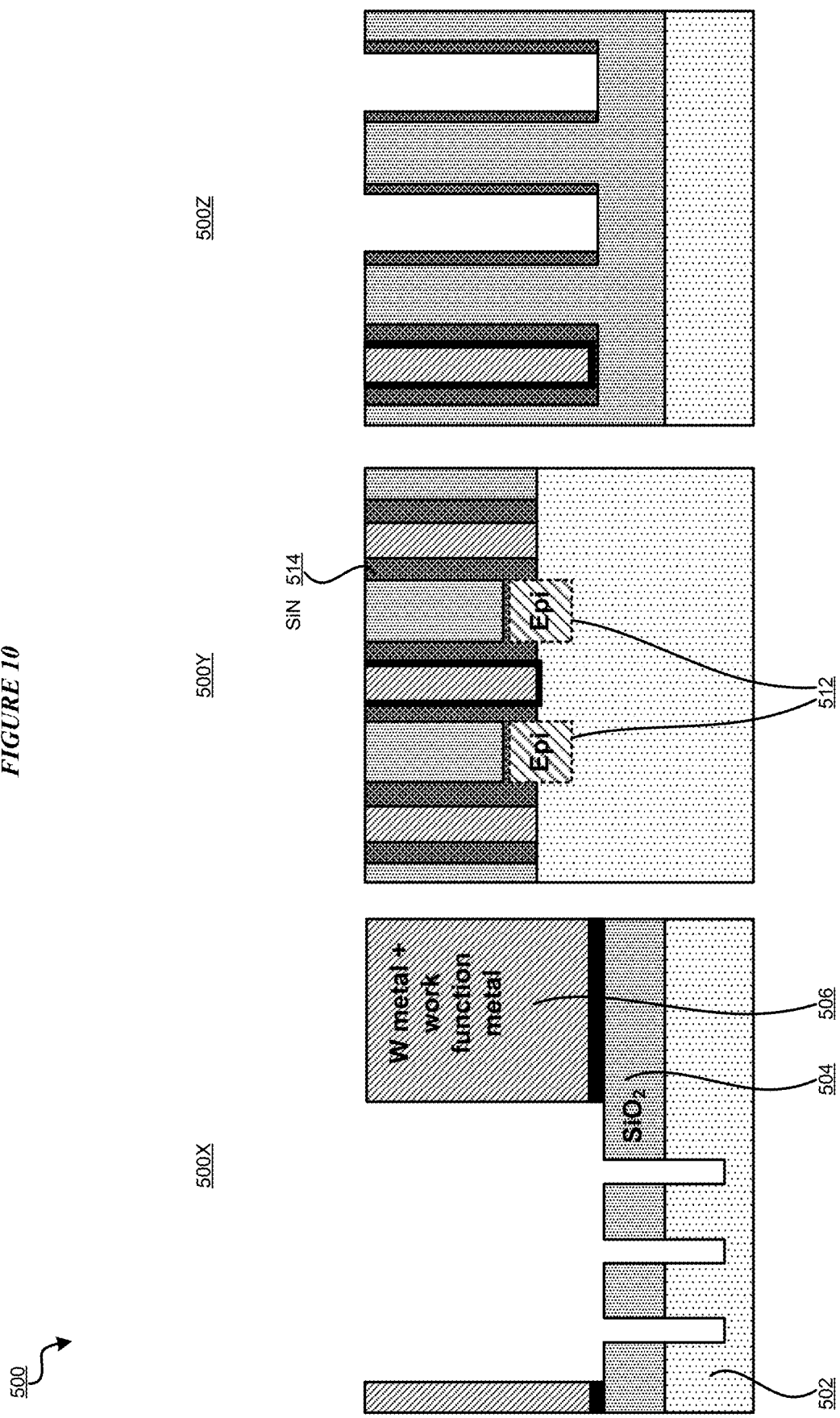
FIG. 10 depicts results of another step in an example process for fabricating a finFET with improved nitride to fin spacing according to an illustrative embodiment.

In FIG. 10, cross-sections 500X, 500Y, and 500Z depict the results of step 312. Substrate 502, $SiO_2$ layer 504, gate 506, fins 508, high-k dielectric material 510, epi 512, and insulator 514 are the same as substrate 502, $SiO_2$ layer 504, gate 506, fins 508, high-k dielectric material 510, epi 512, and insulator 514 in FIG. 9. FIG. 10 shows the results of a process, as described herein, that is selective to metal, silicon dioxide, and silicon nitride, that replaces fins 508 with a recess for the FC cut.

Figure 11:
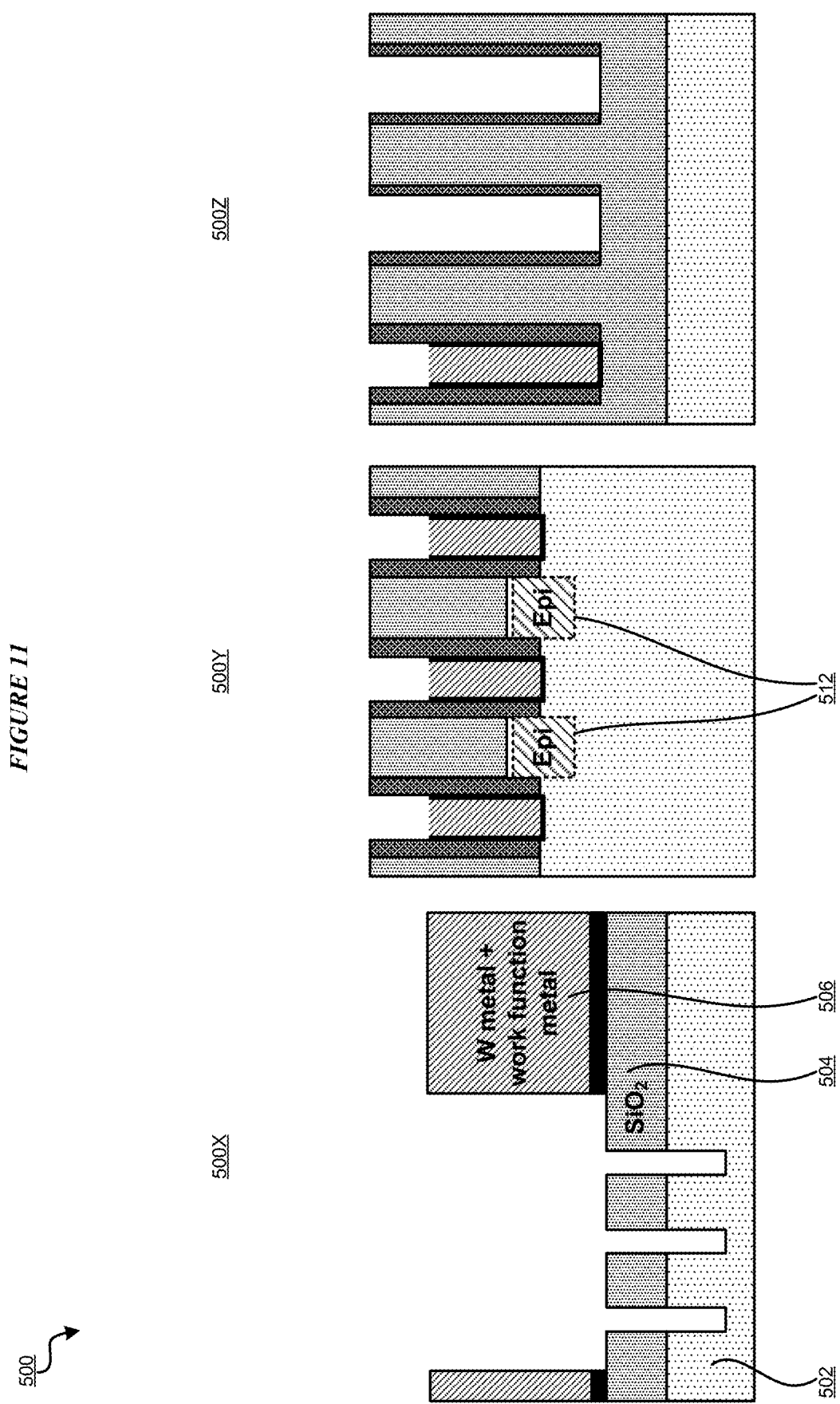
FIG. 11 depicts results of another step in an example process for fabricating a finFET with improved nitride to fin spacing according to an illustrative embodiment.

In FIG. 11, cross-sections 500X, 500Y, and 500Z depict the results of step 314. Substrate 502, substrate 502, $SiO_2$ layer 504, gate 506, fins 508, high-k dielectric material 510, epi 512, and insulator 514 are the same as substrate 502, substrate 502, $SiO_2$ layer 504, gate 506, fins 508, high-k dielectric material 510, epi 512, and insulator 514 in FIG. 10. FIG. 11 shows the results of a process, for example a dry etch process based on, for example, boron trichloride ($BCl_3$) that is selective to silicon dioxide and silicon nitride, is performed to create a recess in gate 506 for the FC cut.

Figure 12:
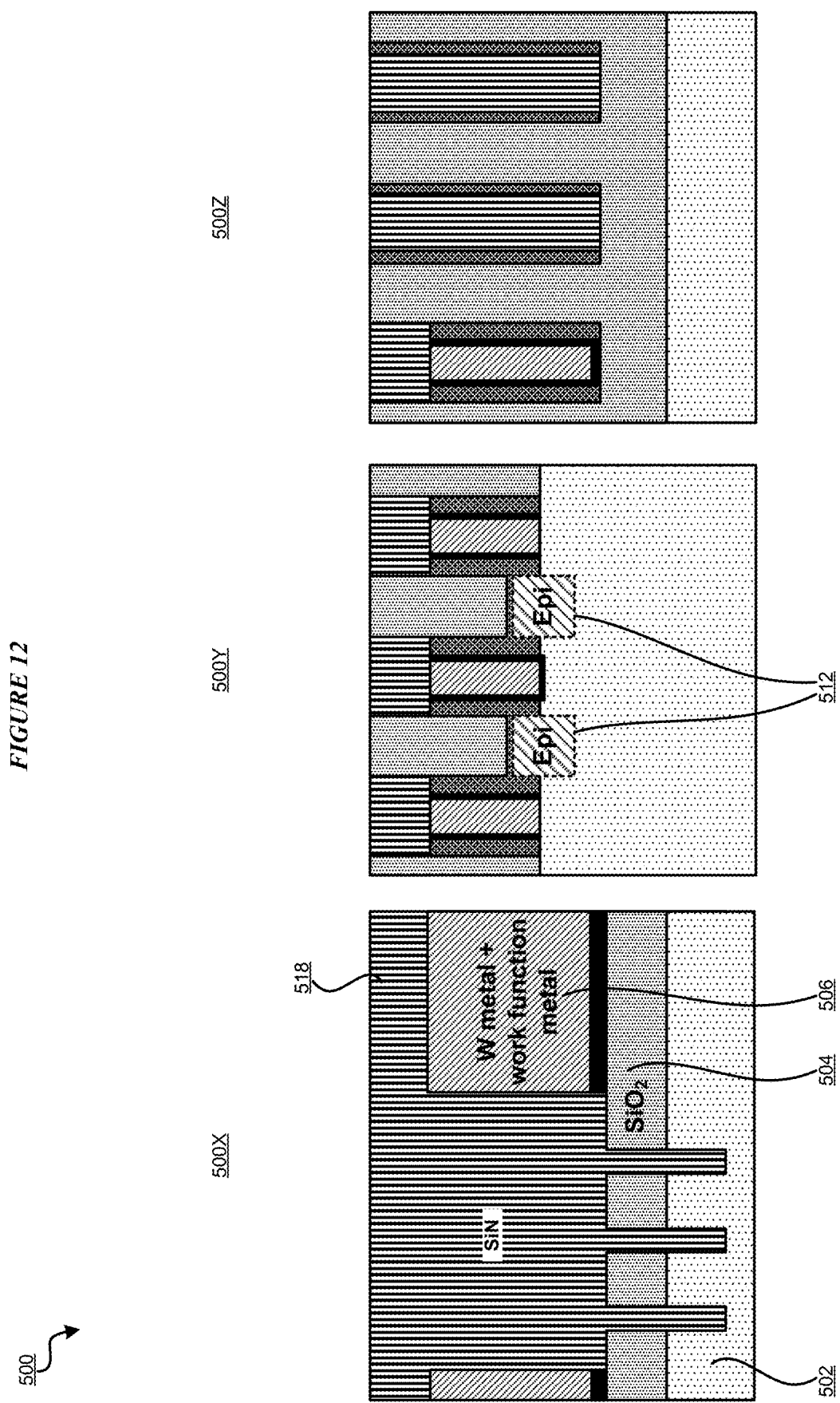
FIG. 12 depicts results of another step in an example process for fabricating a finFET with improved nitride to fin spacing according to an illustrative embodiment.

In FIG. 12, cross-sections 500X, 500Y, and 500Z depict the results of steps 316 and 318. Substrate 502, substrate 502, SiO₂ layer 504, gate 506, fins 508, high-k dielectric material 510, epi 512, and insulator 514 are the same as substrate 502, substrate 502, SiO₂ layer 504, gate 506, fins 508, high-k dielectric material 510, epi 512, and insulator 514 in FIG. 11. FIG. 12 shows the results of a process, for example a silicon nitride deposition, that deposits insulator to form SAC 518, followed by a CMP process performed to planarize the top layer of the semiconductor device such that all structures are even with the top of SiO₂ layer 504.

While certain steps and processes are described with certain structures, it is to be understood that the steps and/or processes can be adapted to fabricate any of the structure variations described herein within the scope of the illustrative embodiments. While certain materials are used in multiple layers or structures, it is to be understood that substitute materials or different but functionally equivalent materials can be used in place of the described materials at any layers described herein within the scope of the illustrative embodiments. While certain fabrication methods have been used at certain steps, it is to be understood that a fabrication method may be omitted, added, or modified at a described step to achieve functionally similar result from the semiconductor structure within the scope of the illustrative embodiments. While certain operations are described as a "step," several operations can be combined together to form a single fabrication step in a process described herein. While certain orientations have been referred to as "top" and "bottom" with reference to an example vertical orientation of the proposed device, it is to be understood that the device can be reoriented laterally such that the top and bottom become left/right or right/left, or bottom and top, or front/back or back/front, as the reorientation case may be.

Thus, a semiconductor device, fabrication method therefor, and a fabrication system or apparatus therefor using a software implementation of the method, are provided in the illustrative embodiments for a finFET with improved nitride to fin spacing and other related features, functions, or operations. Where an embodiment or a portion thereof is described with respect to a type of semiconductor device, the fabrication method, system or apparatus, the software implementation, or a portion thereof, are adaptable or configurable for use with a different manifestation of that type of device.

The present invention may be a semiconductor device, system, a method, and/or a computer program product at any possible technical detail level of integration. The computer program product may include a computer readable storage medium (or media) having computer readable program instructions thereon for causing a processor to carry out aspects of the present invention. A computer readable storage medium, including but not limited to computer-readable storage devices as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network.

What is claimed is:

1. A semiconductor device comprising:
   a dielectric layer oriented substantially parallelly to a substrate;
   a metal layer formed on top of the dielectric layer;
   a fin extending substantially orthogonally from the substrate through the dielectric layer into the metal layer;
   a gate insulator deposited on top of the fins and the dielectric layer;
   an optical projection lithography (OPL) material deposited on a portion of a surface area of the device to form a first covered surface area and a first exposed surface area;
   a first exposed gate insulator area formed by removing the metal layer under the first exposed surface area;
   a first exposed fin area formed by removing the gate insulator from the first exposed gate insulator area; and
   a substantially planar self-aligning gate cap filling a recess in the first exposed fin area and an adjacent area of the metal layer.

2. The semiconductor device of claim 1, wherein the OPL material is removed prior to forming the substantially planar self-aligning gate cap.

3. The semiconductor device of claim 1, wherein the substantially planar self-aligning gate cap is formed by a deposition.

4. The semiconductor device of claim 1, wherein the top surface of the device is rendered substantially planar and excess gate cap material is removed by a planarization.

5. The semiconductor device of claim 1, wherein the recess in the first exposed fin area is formed by a fifth etching and the recess in an adjacent area of the metal layer is formed by a sixth etching.

6. The semiconductor device of claim 5, wherein the fifth etching comprises a dry etch process.

7. The semiconductor device of claim 5, wherein the fifth etching comprises a wet etch process.

8. The semiconductor device of claim 5, wherein the sixth etching comprises a wet etch process.

9. The semiconductor device of claim 5, wherein the sixth etching comprises a dry etch process.

* * * * *